(12) United States Patent  
Anderson

(10) Patent No.: US 11,979,118 B2  
(45) Date of Patent: May 7, 2024

(54) RADIO FREQUENCY DIGITAL TO ANALOG CONVERSION

(71) Applicant: DSP Group Ltd., Herzliya (IL)

(72) Inventor: Steve Anderson, Netanya (IL)

(73) Assignee: DSP Group Ltd., Herzliya (IL)

(*) Notice: Subject to any disclaimer, the term of this patent is extended or adjusted under 35 U.S.C. 154(b) by 188 days.

(21) Appl. No.: 17/455,009

(22) Filed: Nov. 15, 2021

(65) Prior Publication Data

US 2022/0158596 A1     May 19, 2022

Related U.S. Application Data

(60) Provisional application No. 63/198,807, filed on Nov. 13, 2020.

(51) Int. Cl.
  *H03M 1/10* (2006.01)
  *H03F 3/21* (2006.01)

(52) U.S. Cl.
  CPC .......... *H03F 3/211* (2013.01); *H03M 1/1009* (2013.01); *H03F 2200/451* (2013.01)

(58) Field of Classification Search
  CPC .......... H03M 1/66; H03M 1/68; H03M 1/664; H03M 1/0614; H03M 1/74; H03M 1/066; H03M 1/0836; H03F 2200/451; H03F 2200/541; H03F 3/211; H03F 2200/534; H03F 1/565; H03F 1/56; H03F 2203/45731; H03F 3/72; H03F 2200/318; H03F 2200/411; H03F 3/2176; H03F 2200/09; H03F 2203/21139; H03F 1/32; H03F 2200/372; H03F 1/0216; H03F 3/217; H03F 1/3247; H03F 3/189; H03F 1/26; H03F 1/3211; H03F 1/52; H03F 2203/21145; H03F 3/2175

(Continued)

(56) References Cited

U.S. PATENT DOCUMENTS 5,150,072 A * 9/1992 Malec .................. H03F 1/32  
  330/10  
8,674,867 B1 * 3/2014 Klepser .............. H01F 21/12  
  375/295

(Continued)

*Primary Examiner* — Linh V Nguyen  
(74) *Attorney, Agent, or Firm* — Leydig, Voit & Mayer, Ltd.

(57) ABSTRACT

There is provided a RF-DAC that may include (i) a first PAM that includes a first group of first power amplifiers of different amplifications, (ii) a second PAM that includes a second group of second power amplifiers of different amplifications; (iii) a load that includes an output port and a transformer; (iv) power amplifiers control units, and a transformer control unit. During a cycle of operation (i) each one of the first and second PAMs is configured to receive one or more power amplifiers digital control signals and activate a single power amplifier per each of the first and second PAMS, (ii) the transformer control unit is configured to receive a transformer digital control signal and control a transformer parameter of the transformer, and (iii) the transformer is configured to receive a first PAM output signal and a second PAM output signal, and output a transformer output signal that reflects digital information represented by the one or more power amplifiers digital control signals and the transformer digital control signal.

20 Claims, 7 Drawing Sheets

(58) Field of Classification Search
USPC .................................. 341/144–154, 118–120
See application file for complete search history.

(56) References Cited

U.S. PATENT DOCUMENTS

| | | | |
|---|---|---|---|
| 9,812,989 B1* | 11/2017 | Dupuis | H01L 25/18 |
| 9,813,086 B2* | 11/2017 | Lu | H03F 3/211 |
| 2009/0096525 A1* | 4/2009 | Staszewski | H03F 3/602 |
| | | | 330/277 |
| 2015/0340991 A1* | 11/2015 | Lin | H03F 1/0205 |
| | | | 330/252 |
| 2016/0276986 A1* | 9/2016 | Anderson | H03F 3/245 |
| 2017/0077877 A1* | 3/2017 | Anderson | H03F 1/0261 |
| 2018/0076999 A1* | 3/2018 | Luo | H03F 3/245 |
| 2019/0386690 A1* | 12/2019 | Hashemi | H03F 3/21 |

* cited by examiner

RADIO FREQUENCY DIGITAL TO ANALOG CONVERSION

CROSS REFERENCE

This application claims priority from U.S. provisional patent Ser. No. 63/198,807 filing date Nov. 13, 2021 which is incorporated herein by its entirety.

BACKGROUND

All wireless mobile devices (Bluetooth, DECT, GSM, 3G, LTE, WiMax, Wi-Fi 802.11 n/ac, ULE 802.11ah, IoT etc.) including radio frequency Power Amplifiers (RF PAs) are required to be both highly-efficient and highly-linear. Developing of modern power amplifier output stages could be a challenging task in order to simplify the calibration process and reduce the intermodulation products. Sometimes it requires to create a complicated digital multidimensional digital pre-distortion (DPD) linearization algorithm for the power amplifier entire dynamic range, especially for non-linear power stages (Class-E/F/D etc.), which operate in highly efficient mode.

A prior art digital to analog converter may include a unary power cell array and a binary power cell array that are configured to amplify each input RF signal by activating a binary power cell and multiple unitary amplifiers concurrently. prior art digital to analog converter exhibits a very non-linear RF-DAC power curve.

FIG. 1 is an example of a prior art radio frequency analog to digital converter (RF-DAC) power curve 20 is staggered, has various output values that may be obtained using different combinations of control signals, and is very flat at high digital input values. The latter makes it very difficult to distinguish between output values associated with very large range of digital input values.

SUMMARY

There may be provided systems and methods as substantially illustrated in the specification and/or the drawings.

BRIEF DESCRIPTION OF THE DRAWINGS

The embodiments of the disclosure will be understood and appreciated more fully from the following detailed description, taken in conjunction with the drawings in which.

DESCRIPTION OF EXAMPLE EMBODIMENTS

Figure 1:
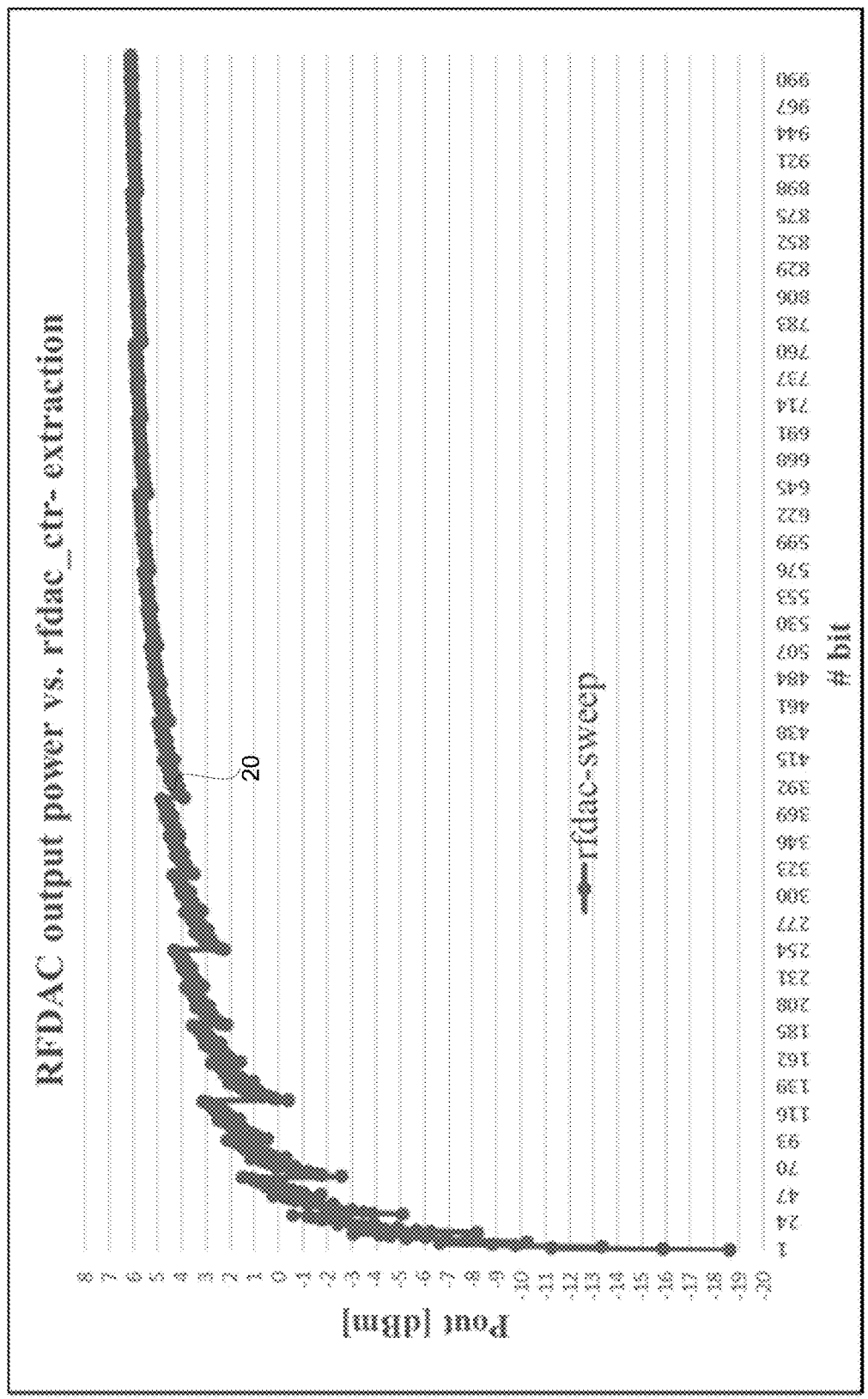
FIG. 1 illustrates an example of a prior art RF-DAC power curve.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device or system capable of executing the method.

Any reference in the specification to a system or device should be applied mutatis mutandis to a method that may be executed by the system or device.

Any combination of any module or unit listed in any of the figures, any part of the specification and/or any claims may be provided.

Any combinations of systems, units, components, processors, sensors, illustrated in the specification and/or drawings may be provided.

The term cycle means a period of time in which digital information of a certain value is converted to an analog value.

A positive RF pulse has a high level (set level or "1" value) during the cycle. It may have another value (for example a low value—that may be a reset level or "0" value) before and/or after being at the high level—for example between cycles.

A negative RF pulse is a pulse that has a low level during the cycle. It may have another value (for example a high level) before and/or after being at the low level—for example between cycles.

The term linear may mean perfectly linear or substantially linear—which allows insignificant (for example up to 5, 10, 15 and 20 percent) deviations from perfect linearity.

Figure 2:
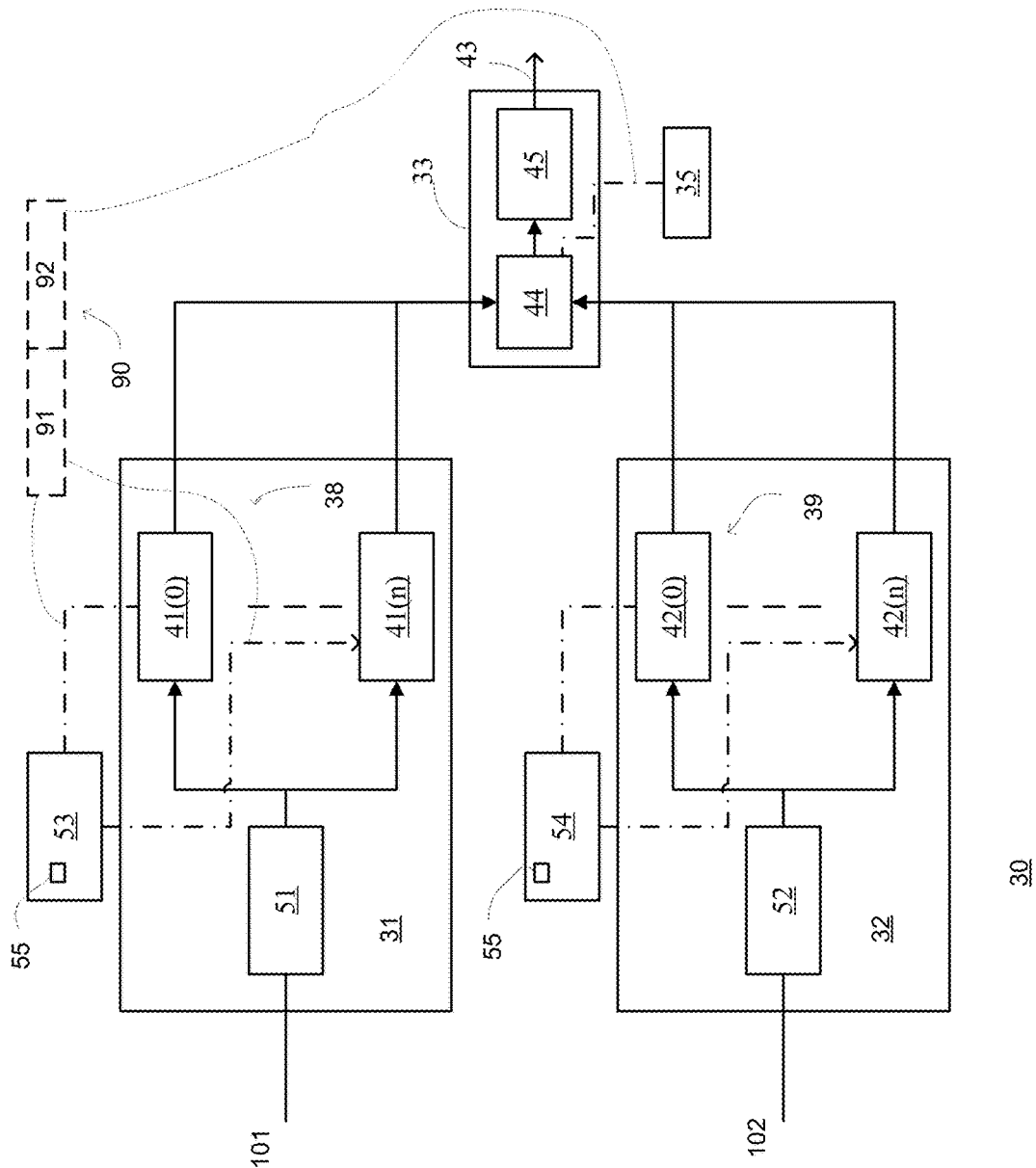
FIG. 2 illustrates an example of a RF-DAC.

FIG. 2 illustrates an example of a RF-DAC. The RF-DAC 30 may include a first power amplification module (PAM) 31, a second PAM 32, a load 33, power amplifiers control units and transformer control unit 35.

The first PAM 31 may include a first group 38 of first power amplifiers 41(0)-41(n) that differ from each other by amplification.

The second PAM 32 may include a second group 39 of second power amplifiers 42(0)-42(n) that differ from each other by amplification.

There may be any relationship between the amplifications of the power amplifiers—for example a 2:1 ratio between amplifications of consecutive power amplifiers.

The load 33 may include an output port 43 and a transformer 44.

The power amplifiers control units may be configured to (a) receive, during a cycle, one or more power amplifiers digital control signals, and (b) activate a single first power amplifier of the first group and a corresponding single second power amplifier of the second group. Corresponding—means activated during the same cycle. Corresponding power amplifiers may have the same amplification value—or may differ from each other by amplification.

The transformer control unit 35 may be configured to (a) receive, during the cycle, a transformer digital control signal, and (b) control a transformer parameter—such as a transfer parameter—for example a power ratio parameter of transformer (ratio between input and output powers).

The transformer may be configured to (a) receive, during the cycle, a first PAM output signal and a second PAM output signal, and (b) output a transformer output signal that reflects digital information 90 represented by the one or more power amplifiers digital control signals 91 and the one or more transformer digital control signals 92.

The RF-DAC may be configured to perform multiple cycles.

The first PAM may be configured to receive, during each of the cycles, a positive RF pulse 101 of a first value; and wherein the second PAM may be configured to receive, during each of the multiple cycles, a negative RF pulse 102 of a second value.

The load 33 may include a filter 45 that may be configured to filter the transformer output signal to provide a filtered signal.

The load may include a load output port 46 that may be configured to output the filtered signal as an output signal of the RF-DAC.

The first PAM may include an input stage 51 that may be configured to receive, during each cycle, a positive RF pulse and to selectively distribute, in parallel, the positive RF pulse to all of the first power amplifiers.

The second PAM may include an input stage 52 that may be configured to receive, during each cycle, a negative RF pulse and to selectively distribute, in parallel, the negative RF pulse to all of the second power amplifiers.

The power amplifiers control units may include first power amplifiers control units 53 that may be configured to (a) receive, during the cycle, one or more first power amplifiers digital control signals, and (b) activate the single first power amplifier of the first group.

Each first power amplifier control unit may precede a first power amplifier, and may be configured to selectively activate the first power amplifier.

The power amplifiers control units may include second power amplifiers control 54 units that may be configured to (a) receive, during the cycle, one or more second power amplifiers digital control signals, and (b) activate the single second power amplifier of the second group.

At least some of the power amplifiers control units may include a logic gate 55 that may be controlled by a power amplifiers digital control signal of the one or more power amplifiers digital control signals.

The transformer control unit may include one or more transformer control circuits, wherein each transformer control circuit may be coupled in parallel to a subset of secondary windings of the transformer.

The one or more transformer control circuits may be a plurality of transformer control circuits.

At least two of the plurality of transformer control circuits may be coupled in parallel to different subsets of the secondary windings.

At least two of the plurality of transformer control circuits may be coupled in parallel to a same subset of the secondary windings.

A transformer control circuit may include a control transistor configured to operate, during the cycle, in a triode mode.

The RF-DAC may exhibits a linear relationship between values of the digital information and on output power of the RF-DAC.

The RF-DAC may be configured to (a) translate different values of the one or more power amplifiers digital control signals to spaced apart points of a RF-DAC power curve, and (b) translate different values of the one or more transformer digital control signals to values that bridge gaps between the spaced apart points of the RF-DAC power curve.

The RF-DAC power curve may be linear.

The transformer may be a load-pull variable transformer (LPVT).

The suggested RF-DAC uses a combination of digitally controlled power amplifiers and a digitally controlled LPVT to obtain a linear RF-DAC power curve. The control is simple, reduces a calibration procedure of the power amplifiers of the RF-DAC, and makes the parameters of the power amplifiers of the RF-DAC more robust over the process, voltage and frequency variation.

Instead of the commonly used power control for RF-DAC power amplifiers, which is based on binary and unary power amplifiers digital cell control—the suggested control scheme includes selecting a single first amplifier and a single second amplifier and also controlling the transformer.

The first and second PAM may be controlled with a coarse resolution, while the transformer provides a finer resolution.

The suggested RF-DAC can exhibit a linear RF-DAC power curve over one or more dynamic ranges.

The RF-DAC can be implemented into any front-end/transceiver without penalties in current consumptions or silicon die size.

Figure 3:
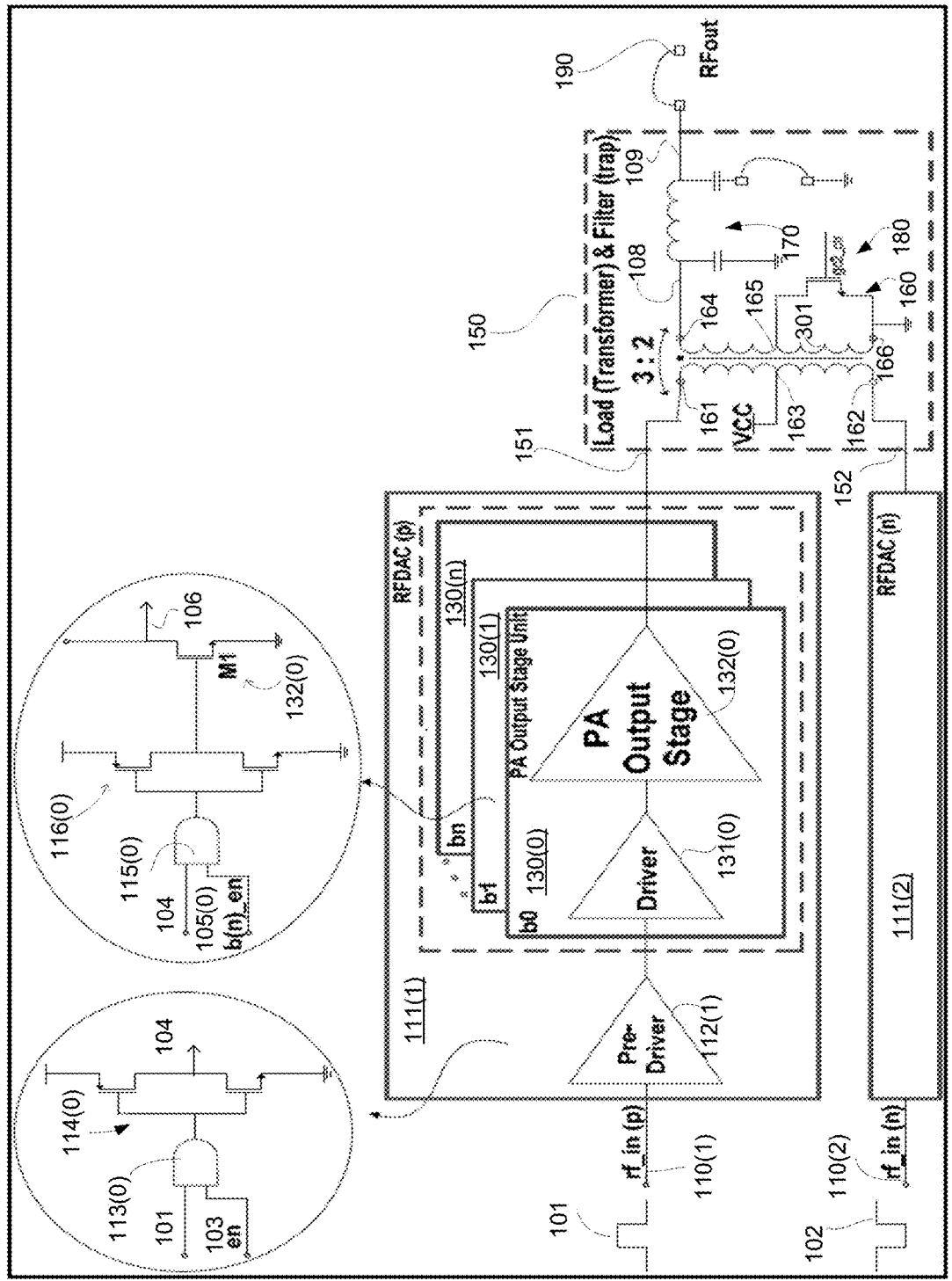
FIG. 3 illustrates an example of a RF-DAC.

FIG. 3 illustrates a RF-DAC 100 that includes first PAM 111(1), second PAM 111(2), load 150, and power amplifiers control units such as drivers (for example driver 131(0)) that are included within the first PAM—one driver per first power amplifier.

For simplicity of explanation the content of second PAM 111(2) is not shown—it should be identical to the content of first PAM 111(1).

First PAM 111(1) includes a first group of power amplifier stage units 130(0)-130(n), each including a driver that preceded a first power amplifier. For simplicity of explanation the content of power amplifier stage unit 130(0) is shown as includes driver 131(0) and power amplifier 132(0).

The first PAM 111(1) also includes a pre-driver 112(1) having an output that is coupled in parallel to the inputs of the first group of power amplifier stage units 130(0)-130(n).

The pre-driver 112(1) may act as a buffer and may selectively allow (or block) a positive RF pulse 101 received at an input 110(1) of the first PAM 111(1) to reach the first group of power amplifier stage units 130(0)-130(n).

FIG. 3 illustrates that the pre-driver 112(1) includes a logic gate 113(0) that is followed by an inverter 114(0) controlled by an enable signal (en) 103 that may cause the pre-driver 112(0) to block the positive RF pulse 101 or to output the positive RF pulse 101 as the output signal 104 of the pre-driver 112(1).

FIG. 3 illustrates the driver 131(0) as including another logic gate 115(0) that is followed by another inverter 116(0) controlled by zeroth first power amplifier enable signal (b(0)_en) 105(0) that may cause the driver 131(0) to deactivate the zeroth first power amplifier 132(0) or to provide to the zeroth first power amplifier 132(0) the positive RF pulse 101.

The zeroth first power amplifier 132(0) may amplify the positive RF pulse 101 to provide an amplifier signal 106.

FIG. 3 illustrates the transformer control unit as being a control transistor 180 that may be configured to operate, during the cycle, in a triode mode. The impedance of the control transistor is determined by a transformer digital control signal that is fed to the gate of the control transistor 180. The control transistor 180 is coupled in parallel to a first subset 301 of secondary windings of the transformer 160—the subset is located between the fifth port 165 and the sixth port 166 of the transformer 160.

Due to the parallel coupling—changes in the impedance of the control transistor change the output impedance of the transformer—and change the relationship between the input signal to the output signal of the transformer.

Any other transformer control unit may be provided.

A first port 161 of the transformer is coupled (via a first input 151 of the load) to an output port of the first PAM 111(1). A second port 162 of the transformer is coupled (via a second input 152 of the load) to an output port of the second PAM 111(2). A third port 163 of the transformer receives a power supply Vcc.

The filter 170 (for example a filter including an inductor coupled between two grounded capacitors) is coupled between the output of the transformer (fourth port 164) and an output 190 of the RF-DAC 100. Any other filter may be provided.

The filter receives a transformer output signal 108 and outputs a filtered signal 109.

Figure 4:
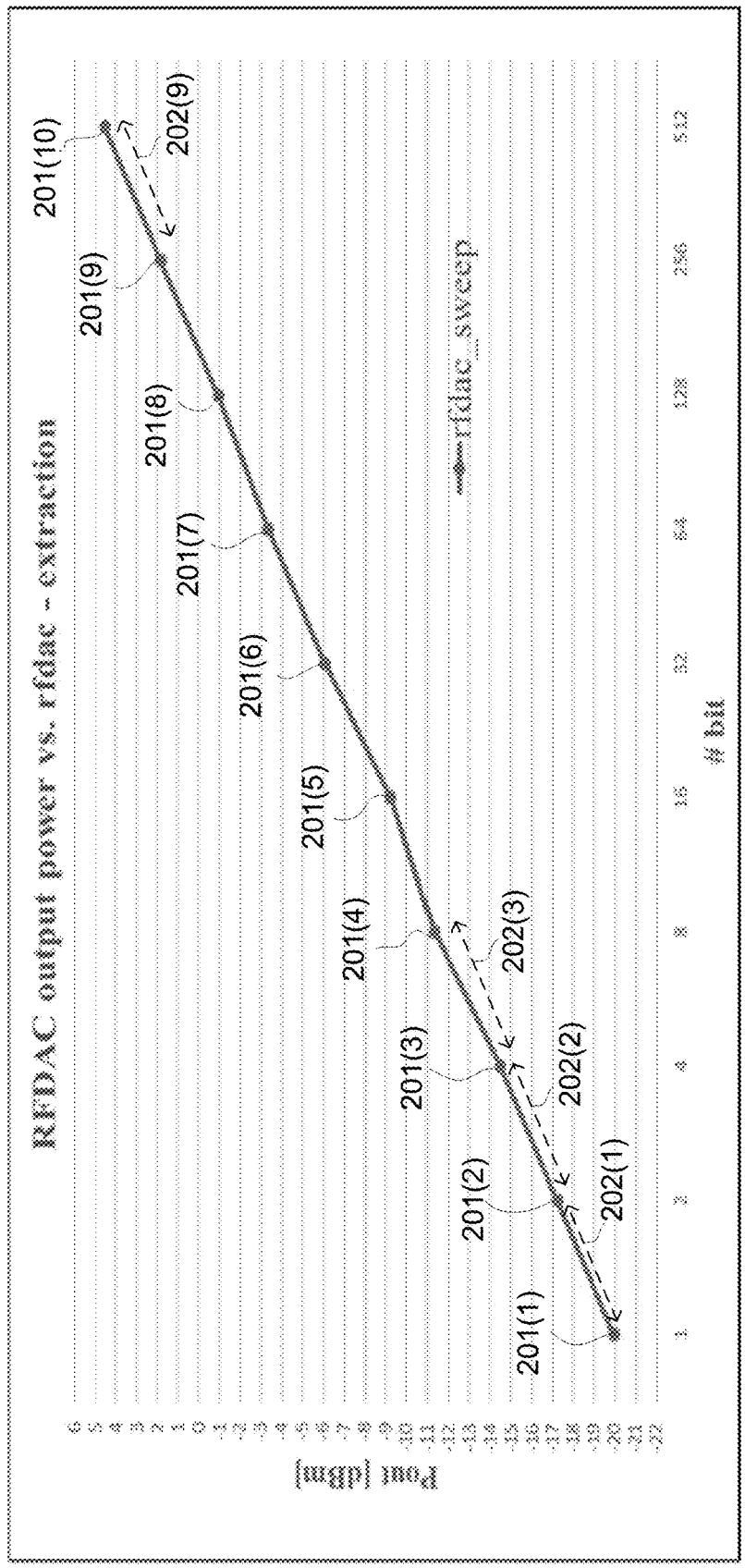
FIG. 4 illustrates an example of a RF-DAC power curve.

FIG. 4 illustrates a linear (rather a substantial linear) RF DAF power curve. The x-axis is a value of digital information while the y-axis is the output power of the RF-DAC.

FIG. 4 illustrates that The RF-DAC may be configured to:
Translate different values of the one or more power amplifiers digital control signals to spaced apart points of a RF-DAC power curve. See points 201(1), 201(2), 202(3), 201(4), 201(5), 201(6), 201(7), 201(8), 201(9) and 201(10) of ten different power amplifiers corresponding to digital information values (or codes) 1, 2, 4, 8, 16, 32, 64, 128, 256 and 512.
Translate different values of the one or more transformer digital control signals to bridge gaps between the spaced apart points of the RF-DAC power curve. See for example interval 202(1) between points 201(1) and 201(2), interval 202(2) between points 201(2) and 201(3), interval 202(1) between points 201(1) and 201(2), interval 202(3) between points 201(3) and 201(4), and interval 202(9) between points 201(9) and 201(10). For simplicity of explanation only four of the nine intervals are associated with arrows and reference numbers.

Figure 5:
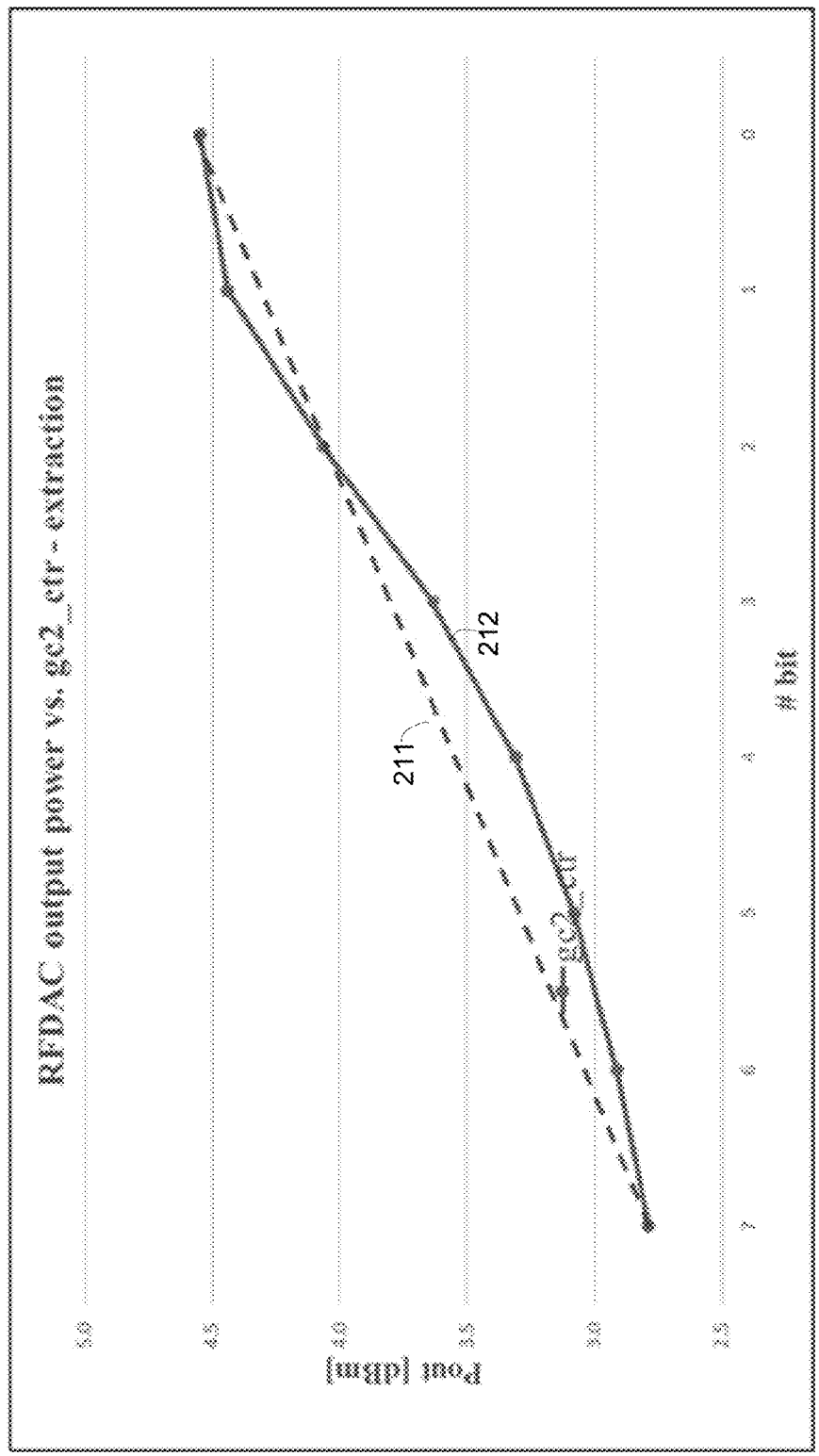
FIG. 5 illustrates an example of a RF-DAC power curve.

FIG. 5 illustrates a perfect linear 211 RF-DAC power curve and a substantially linear 212 RF-DAC curve. The substantially linear RF-DAC curve 212 may be acceptable or may be further modified—for example via calibration or any other corrective means.

Figure 6:
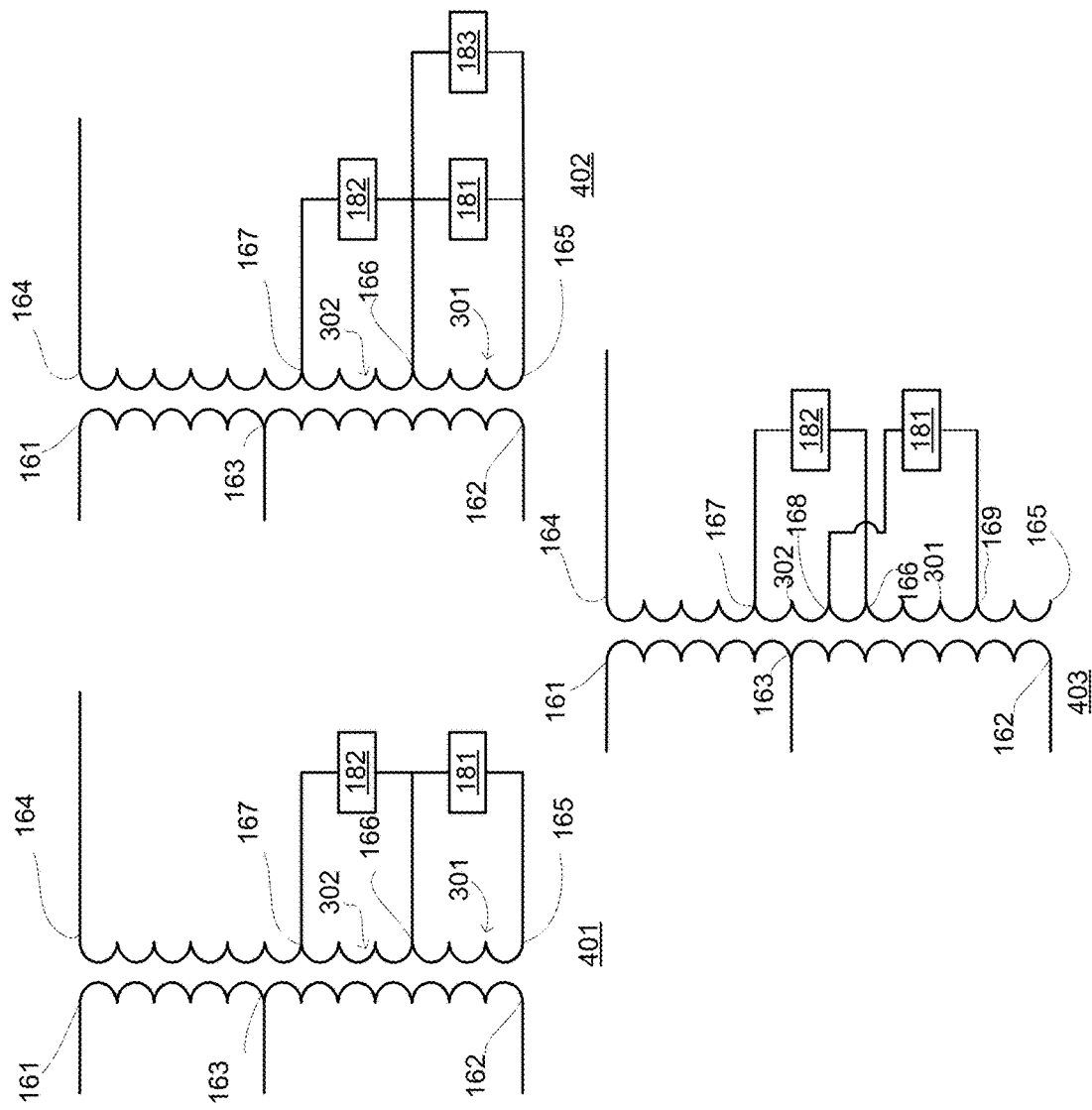
FIG. 6 illustrates an example of transformers and transformer control units.

FIG. 6 illustrates examples of a transformer and transformer control units

All three examples 401, 402 and 403 illustrate the transformer as including first till seventh ports—denoted 161, 162, 163, 164, 165, 166 and 167, respectively. The third example 403 also illustrates an eighth port 168 and a ninth port 169.

The first example 401 illustrates two transformer control units—denoted 181 and 182 respectively.

The first transformer control unit 181 is coupled (via links or nets) in parallel to the first subset 301 of secondary windings (via fifth and sixth transformer ports 165 and 166).

The second transformer control unit 182 is coupled (via links or nets) in parallel to a second subset 302 of secondary windings (via sixth and seventh transformer ports 166 and 167). The first and second subsets do not overlap. They are illustrated as being adjacent to each other—but this is just an example. The first and second subset may include the same number of secondary windings—but may differ from each other by the number of secondary windings.

The first example 402 illustrates three transformer control units 181, 182 and 183.

The first and third transformer control units 183 and 181 are coupled (via links or nets) in parallel to the first subset 301 of secondary windings (to fifth and sixth transformer ports 165 and 166). Having two transformer control units in parallel provides a finer control of the impedance of the first subset—as the impedances of the first and third transformer control units are parallel to each other.

The third example 401 illustrates two transformer control units 181 and 182.

The third transformer control unit 181 is coupled (via links or nets) in parallel to the first subset 301 of secondary windings (to fifth and sixth transformer ports 169 and 168).

The second transformer control unit 182 is coupled (via links or nets) in parallel to a second subset 302 of secondary windings (to sixth and seventh transformer ports 166 and 167). The first and second subsets do partially overlap.

Any transformer control unit may be coupled to any subset of secondary windings via any port of the transformer.

Figure 7:
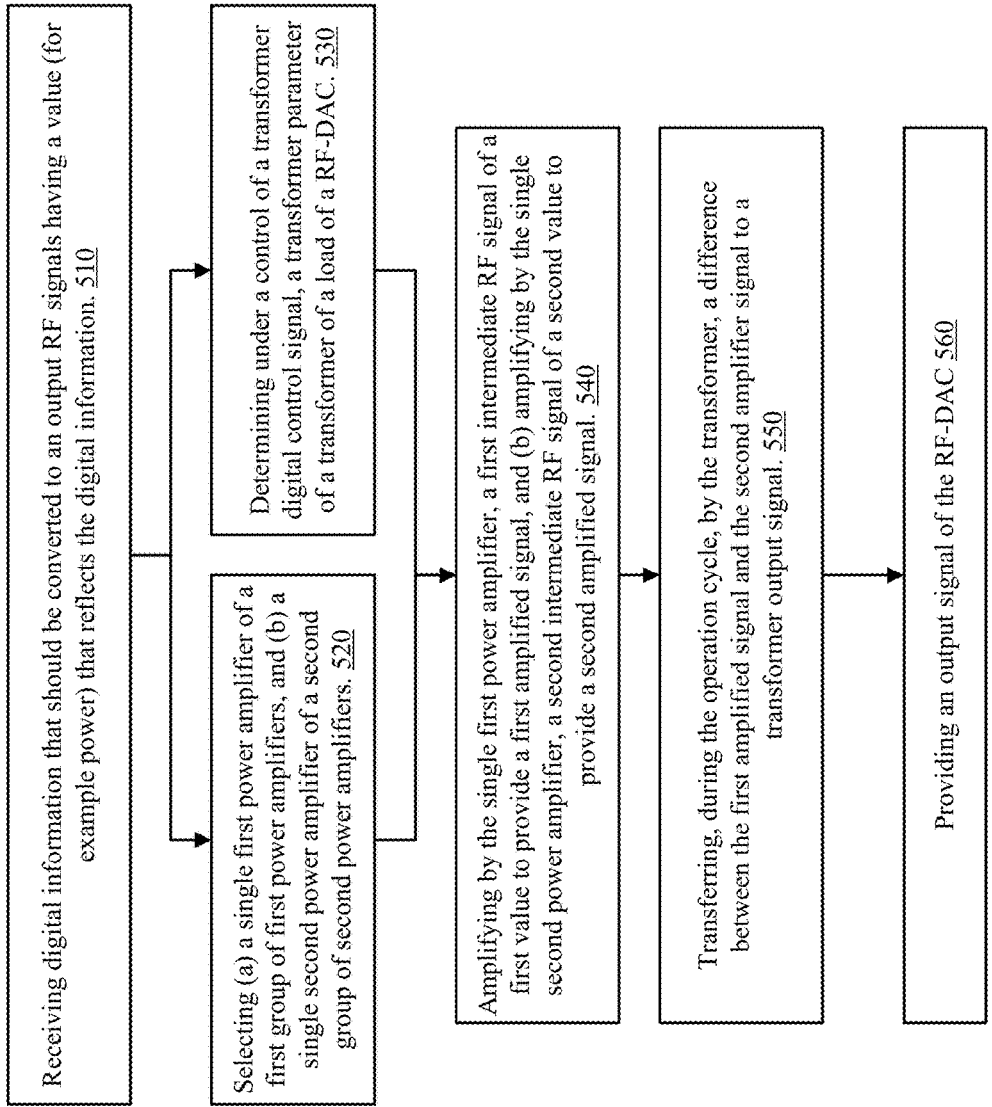
FIG. 7 illustrates an example of a method.

FIG. 7 illustrates an example of a method 500 for operating a RF-DAC. The RF-DAC may be any of the mentioned above RF-DACs.

The method is executed in multiple cycles—during each cycle, a pair of RF pulses (such as a positive RF pulse and negative RF pulse) may be provided and amplified according to digital information provided per cycle. The values of the pair of RF pulses may be constant over different cycles. There may be a time gap between one cycle to the other.

Method 500 may start by step 510 of receiving digital information that should be converted to an output RF signals having a value (for example power) that reflects the digital information. The digital information may include or may be converted (in any manner) to one or more power amplifiers control signals and one or more transformer control signals. The conversion may include splitting the digital information or applying any function on the digital information.

Step 510 may be followed by steps 520 and 530.

Step 520 may include selecting (a) a single first power amplifier of a first group of first power amplifiers, and (b) a single second power amplifier of a second group of second power amplifiers. The selecting is done under a control of one or more power amplifiers digital control signals.

Step 530 may include determining under a control of a transformer digital control signal, a transformer parameter of a transformer of a load of a RF-DAC.

Step 520 may be followed by step 540 of (a) amplifying by the single first power amplifier, a first intermediate RF signal of a first value to provide a first amplified signal, and (b) amplifying by the single second power amplifier, a second intermediate RF signal of a second value to provide a second amplified signal.

Steps 530 and 540 may be followed by step 550 of transferring, during the cycle, by the transformer, a difference between the first amplified signal and the second amplifier signal to a transformer output signal.

Step 550 may be followed by step 560 of providing an output signal of the RF-DAC. Step 560 may include filtering the transformer output signal, processing in any other manner the transformer output signal or providing the transformer output signal as the output signal of the RF-DAC.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It is appreciated that various features of the embodiments of the disclosure which are, for clarity, described in the contexts of separate embodiments may also be provided in combination in a single embodiment. Conversely, various features of the embodiments of the disclosure which are, for brevity, described in the context of a single embodiment may also be provided separately or in any suitable sub-combination.

It will be appreciated by persons skilled in the art that the embodiments of the disclosure are not limited by what has been particularly shown and described hereinabove. Rather the scope of the embodiments of the disclosure is defined by the appended claims and equivalents thereof.

What is claimed is:

1. A radio frequency digital to analog converter (RF-DAC), comprising:
    a first power amplification module (PAM) that comprises a first group of first power amplifiers that differ from each other by amplification;
    a second PAM that comprises a second group of second power amplifiers that differ from each other by amplification;
    a load that comprises an output port and a transformer;
    power amplifiers control units that are configured to (a) receive, during a cycle, one or more power amplifiers digital control signals, and (b) activate a single first power amplifier of the first group and a corresponding single second power amplifier of the second group;
    a transformer control unit that is configured to (a) receive, during the cycle, a transformer digital control signal, and (b) control a transformer parameter of the transformer, wherein the transformer control unit comprises one or more transformer control circuits, wherein each transformer control circuit is coupled in parallel to a subset of secondary windings of the transformer; and
    wherein the transformer is configured to (a) receive, during the cycle, a first PAM output signal and a second PAM output signal, and (b) output a transformer output signal that reflects digital information represented by the one or more power amplifiers digital control signals and the transformer digital control signal.

2. The RF-DAC according to claim 1 wherein the RF-DAC is configured to perform multiple cycles.

3. The RF-DAC according to claim 2 wherein the first PAM is configured to receive, during each of the multiple cycles, a positive RF pulse of a first value; and wherein the second PAM is configured to receive, during each of the multiple cycles, a negative RF pulse of a second value.

4. The RF-DAC according to claim 1 wherein the load comprises a filter that is configured to filter the transformer output signal to provide a filtered signal.

5. The RF-DAC according to claim 4 wherein the load comprises a load output port that is configured to output the filtered signal as an output signal of the RF-DAC.

6. The RF-DAC according to claim 1 wherein the first PAM comprises an input stage that is configured to receive, during each cycle, a positive RF pulse and to selectively distribute, in parallel, the positive RF pulse to all of the first power amplifiers.

7. The RF-DAC according to claim 1 wherein the second PAM comprises an input stage that is configured to receive, during each cycle, a negative RF pulse and to selectively distribute, in parallel, the negative RF pulse to all of the second power amplifiers.

8. The RF-DAC according to claim 1 wherein the power amplifiers control units comprise first power amplifiers control units that are configured to (a) receive, during the cycle, one or more first power amplifiers digital control signals, and (b) activate the single first power amplifier of the first group.

9. The RF-DAC according to claim 8 wherein each first power amplifiers control units precedes a first power amplifier, and is configured to selectively activate the first power amplifier.

10. The RF-DAC according to claim 8 wherein the power amplifiers control units comprise second power amplifiers control units that are configured to (a) receive, during the cycle, one or more second power amplifiers digital control signals, and (b) activate the single second power amplifier of the second group.

11. The RF-DAC according to claim 1 wherein at least some of the power amplifiers control units comprise a logic gate that is controlled by a power amplifiers digital control signal of the one or more power amplifiers digital control signals.

12. The RF-DAC according to claim 1 wherein the one or more transformer control circuits are a plurality of transformer control circuits, and wherein at least two of the plurality of transformer control circuits are coupled in parallel to different subsets of the secondary windings.

13. The RF-DAC according to claim 1 wherein the one or more transformer control circuits are a plurality of transformer control circuits, and wherein at least two of the plurality of transformer control circuits are coupled in parallel to a same subset of the secondary windings.

14. The RF-DAC according to claim 1 wherein a transformer control circuits of the one or more transformer control circuits comprises a control transistor configured to operate, during the cycle, in a triode mode.

15. The RF-DAC according to claim 1 wherein RF-DAC exhibits a linear relationship between values of the digital information and an output power of the RF-DAC.

16. The RF-DAC according to claim 1 wherein the RF-DAC is configured to (a) translate different values of the one or more power amplifiers digital control signals to spaced apart points of a RF-DAC power curve, and (b) translate different values of the one or more transformer digital control signals to bridge gaps between the spaced apart points of the RF-DAC power curve.

17. The RF-DAC according to claim 16 wherein the RF-DAC power curve is linear.

18. A method for radio frequency digital to analog conversion, the method comprises:
determining, during a cycle and under a control of a transformer digital control signal received by a transformer control unit, a transformer parameter of a transformer of a load of a radio frequency digital to analog converter (RF-DAC), wherein the transformer control unit comprises one or more transformer control circuits, wherein each transformer control circuit is coupled in parallel to a subset of secondary windings of the transformer;
activating, during a cycle and under a control of one or more power amplifiers digital control signals, a single first power amplifier of a first group of power amplifiers and a single second power amplifier of a second group of power amplifiers;
amplifying, during the cycle and by the single first power amplifier, a first intermediate RF signal of a first value to provide a first amplified signal;
amplifying, during the cycle and by the single second power amplifier, a second intermediate RF signal of a second value to provide a second amplified signal; and
transferring, during the cycle, by the transformer, a difference between the first amplified signal and the second amplified signal to a transformer output signal.

19. The method of claim 18, further comprising:
outputting, by the transformer, an output signal that reflects digital information represented by the digital control signals and the transformer digital control signal, wherein a linear relationship exists between values of the digital information and an output power of the RF-DAC.

20. The method of claim 18, further comprising:
translating different values of the one or more power amplifiers digital control signals to spaced apart points of a RF-DAC power curve, and translating different values of the transformer digital control signals to bridge gaps between the spaced apart points of the RF-DAC power curve.

* * * * *